United States Patent
Lee et al.

(10) Patent No.: US 10,928,255 B2
(45) Date of Patent: Feb. 23, 2021

(54) DEVICE FOR MEASURING THERMOELECTRIC PERFORMANCE

(71) Applicant: Electronics and Telecommunications Research Institute, Daejeon (KR)

(72) Inventors: Jaewoo Lee, Sejong-si (KR); Jungyun Kwon, Daejeon (KR); Junsoo Kim, Daejeon (KR); Seungeon Moon, Daejeon (KR); Seung Min Lee, Suwon-si (KR); Solyee Im, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 567 days.

(21) Appl. No.: 15/708,297

(22) Filed: Sep. 19, 2017

(65) Prior Publication Data

US 2018/0106685 A1  Apr. 19, 2018

(30) Foreign Application Priority Data

Oct. 19, 2016 (KR) .................. 10-2016-0136055
Feb. 17, 2017 (KR) .................. 10-2017-0021787

(51) Int. Cl.
  *G01K 7/02* (2006.01)
  *G01N 25/32* (2006.01)
  *H01L 35/34* (2006.01)

(52) U.S. Cl.
  CPC ............... *G01K 7/02* (2013.01); *G01N 25/32* (2013.01); *H01L 35/34* (2013.01)

(58) Field of Classification Search
  CPC combination set(s) only.
  See application file for complete search history.

(56) References Cited

U.S. PATENT DOCUMENTS 3,733,887 A * 5/1973 Stanley .................. G01N 25/18
                                                                          374/44
3,737,762 A * 6/1973 Fletcher .................. H01L 35/00
                                                                          324/451

(Continued)

FOREIGN PATENT DOCUMENTS

KR   10-0499351 B1   7/2005
KR   10-1082353 B1   11/2011

(Continued)

*Primary Examiner* — Lisa M Caputo
*Assistant Examiner* — Janice M Soto
(74) *Attorney, Agent, or Firm* — Rabin & Berdo, P.C.

(57) ABSTRACT

The present disclosure herein relates to a device for measuring a thermoelectric performance. The device for measuring a thermoelectric performance of a thermoelectric material, which includes a support module configured to generate temperature difference between both ends of the thermoelectric material, a fixing module detachably coupled to the support module to support the thermoelectric material, a temperature measuring unit electrically connected to the fixing module to measure temperature of each of the both ends of the thermoelectric material, and an electromotive force measuring unit electrically connected to the fixing module to measure thermoelectromotive force generated between the both ends of the thermoelectric material. Here, the fixing module includes a first heat sink part and a second heat sink part, which respectively support the both ends of the thermoelectric material.

13 Claims, 8 Drawing Sheets

(56) References Cited

U.S. PATENT DOCUMENTS

2015/0092812 A1    4/2015   Jun et al.
2015/0130472 A1    5/2015   Jun et al.

FOREIGN PATENT DOCUMENTS

| KR | 20130028377 A | * | 3/2013 |
| KR | 10-1302750 B1 | | 8/2013 |
| KR | 10-2015-0007686 A | | 1/2015 |

* cited by examiner

DEVICE FOR MEASURING THERMOELECTRIC PERFORMANCE

CROSS-REFERENCE TO RELATED APPLICATIONS

This U.S. non-provisional patent application claims priority under 35 U.S.C. § 119 of Korean Patent Application Nos. 10-2016-0136055, filed on Oct. 19, 2016, and 10-2017-0021787, filed on Feb. 17, 2017, the entire contents of which are hereby incorporated by reference.

BACKGROUND

The present disclosure herein relates to a device for measuring a thermoelectric performance, and more particularly, to a device for measuring a thermoelectric performance including a detachable specimen fixing part.

Thermoelectric effect represents reversible and direct energy conversion between heat and electricity and includes a phenomenon generated by phonon transfer caused by transfer of an electron and hole in a material. The thermoelectric effect is divided into the Peltier effect applied in a cooling field using temperature difference between both ends, which is formed by current applied from the outside and the Seebeck effect applied in a power generation field using an electromotive force generated from temperature difference between both ends of a material.

As the importance of a new renewable energy is emerged, a thermoelectric material has been applied in various fields. In recent years, research on energy harvesting at low temperature difference is being performed to apply the thermoelectric material to a wearable device. Thus, a device for measuring a thermoelectric performance for a small sized thermoelectric material is demanded.

SUMMARY

The present disclosure provides a device for measuring a thermoelectric performance, to which a thermoelectric material is easily mounted and which simply measures a thermoelectric performance.

The present disclosure also provides a device for measuring a thermoelectric performance, which is capable of measuring a thermoelectric performance of a small sized thermoelectric material.

The object of the present invention is not limited to the aforesaid, but other objects not described herein will be clearly understood by those skilled in the art from descriptions below.

An embodiment of the inventive concept provides a device for measuring a thermoelectric performance of a thermoelectric material, which includes: a support module configured to generate temperature difference between both ends of the thermoelectric material; a fixing module supporting the thermoelectric material, the fixing module being detachably coupled to the support module; a temperature measuring unit electrically connected to the fixing module to measure temperature of each of the both ends of the thermoelectric material; and an electromotive force measuring unit electrically connected to the fixing module to measure thermoelectromotive force generated between the both ends of the thermoelectric material. Here, the fixing module includes a first heat sink part and a second heat sink part, which respectively support the both ends of the thermoelectric material.

In an embodiment, the first heat sink part and the second heat sink part may apply pressure to the both ends of the thermoelectric material to support the thermoelectric material.

In an embodiment, the fixing module may include at least one stress maintaining member disposed between the first heat sink part and the second heat sink part, and, while the fixing module supports the thermoelectric material, the above pressure may be constantly maintained by the stress maintaining member.

In an embodiment, the first heat sink part may include at least one first guide groove, the second heat sink part may include at least one second guide groove, and the stress maintaining member may be inserted into and coupled to the first guide groove and the second guide groove.

In an embodiment, each of the first heat sink part and the second heat sink part may include: an electrode; and a temperature sensor. Here, while the fixing module is coupled to the support module, the electrode may be electrically connected to the electromotive force measuring unit, and the temperature sensor may be electrically connected to the temperature measuring unit.

In an embodiment, the support module may include a first support module and a second support module, and the first support module and a second support module may respectively apply pressure to both ends of the fixing module to support the fixing module.

In an embodiment, the second support module may move to be disposed adjacent to or spaced apart from the first support module by the transfer module, thereby being coupled to or separated from the fixing module.

In an embodiment, each of the first support module and the second support module may include a coupling protrusion disposed on each of mutually facing ends thereof, the fixing module may include a coupling groove defined in each of both ends facing the support modules, and, when the fixing module is coupled to the support module, the coupling protrusion may be inserted into and coupled to the coupling groove.

In an embodiment, the support module may include a first support module and a second support module, each of the first support module and the second support module may include a first terminal disposed on each of mutually facing surfaces thereof, the fixing module may include a second terminal disposed on each of surfaces facing the support modules, and, while the fixing module is coupled to the support module, the first terminal may be electrically connected to the second terminal.

In an embodiment, the temperature measuring unit and the electromotive force measuring unit may be electrically connected to the first terminal through first wires.

In an embodiment, each of the first heat sink part and the second heat sink part may include: an electrode; and a temperature sensor, and the electrode and the temperature sensor may be electrically connected to the second terminal through second wires.

In an embodiment, each of the first heat sink part and the second heat sink part may include: an electrode; and a temperature sensor, and, while the fixing module supports the thermoelectric material, the electrode may contact the thermoelectric material, and the temperature sensor may be disposed adjacent to the thermoelectric material.

In an embodiment, the device may further include a temperature control unit configured to control temperature of the support module, and the temperature control unit may be electrically connected to the temperature measuring unit and feedback-controlled In an embodiment, the device may further include a vacuum chamber, and the support module may be disposed in the vacuum chamber, and the chamber may maintain a vacuum state while the thermoelectric performance of the thermoelectric material is measured.

In an embodiment, while the thermoelectric performance of the fixing module is measured, the fixing module may be supported by the support module and spaced apart from a bottom surface of the chamber.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

The objects, other objectives, features, and advantages of the inventive concept will be understood without difficulties through preferred embodiments below related to the accompanying drawings. The inventive concept may, however, be embodied in different forms and should not be construed as limited to the embodiments set forth herein. Rather, these embodiments are provided so that this disclosure will be thorough and complete, and will fully convey the scope of the present invention to those skilled in the art.

In this specification, it will also be understood that when another component is referred to as being 'on' one component, it can be directly on the one component, or an intervening third component may also be present. Also, in the figures, the dimensions of components are exaggerated for clarity of illustration.

In the specification, the technical terms are used only for explaining a specific exemplary embodiment while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Hereinafter, a device for measuring a thermoelectric performance (hereinafter, referred to as a thermoelectric performance measuring device) according to an embodiment of the inventive concept will be described with reference to the accompanying drawings.

Figure 1:
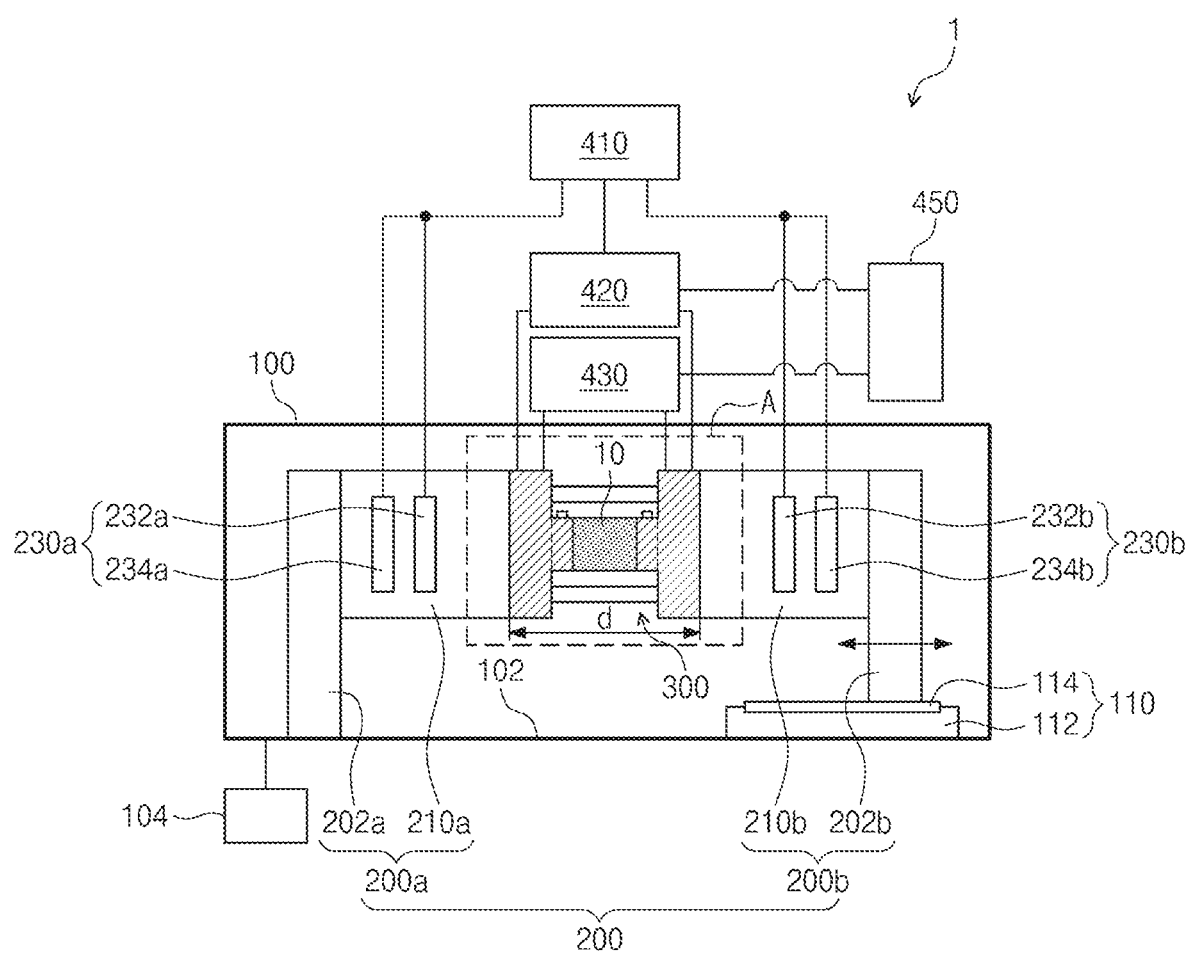
FIGS. 1 and 2 are views for explaining a thermoelectric performance measuring device according to an embodiment of the inventive concept.
Figure 2:
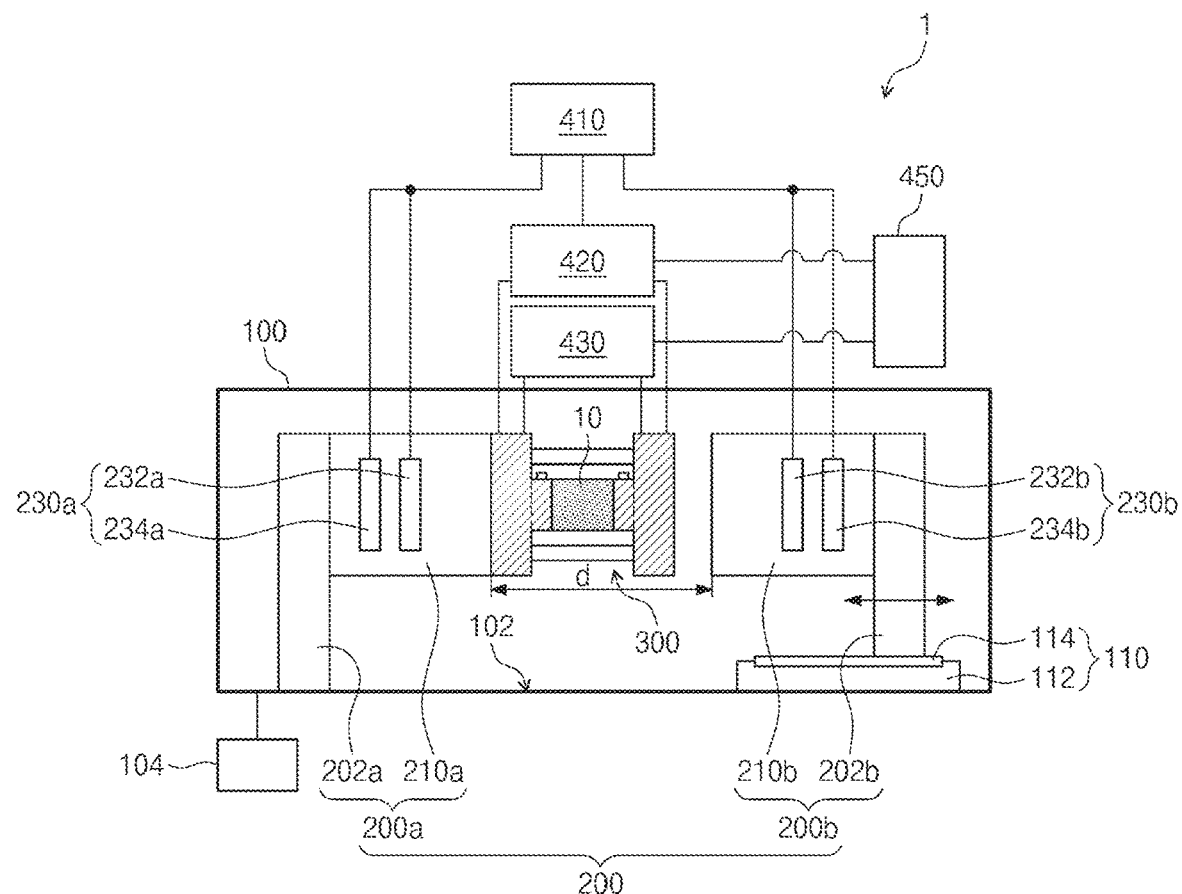
Figure 3:
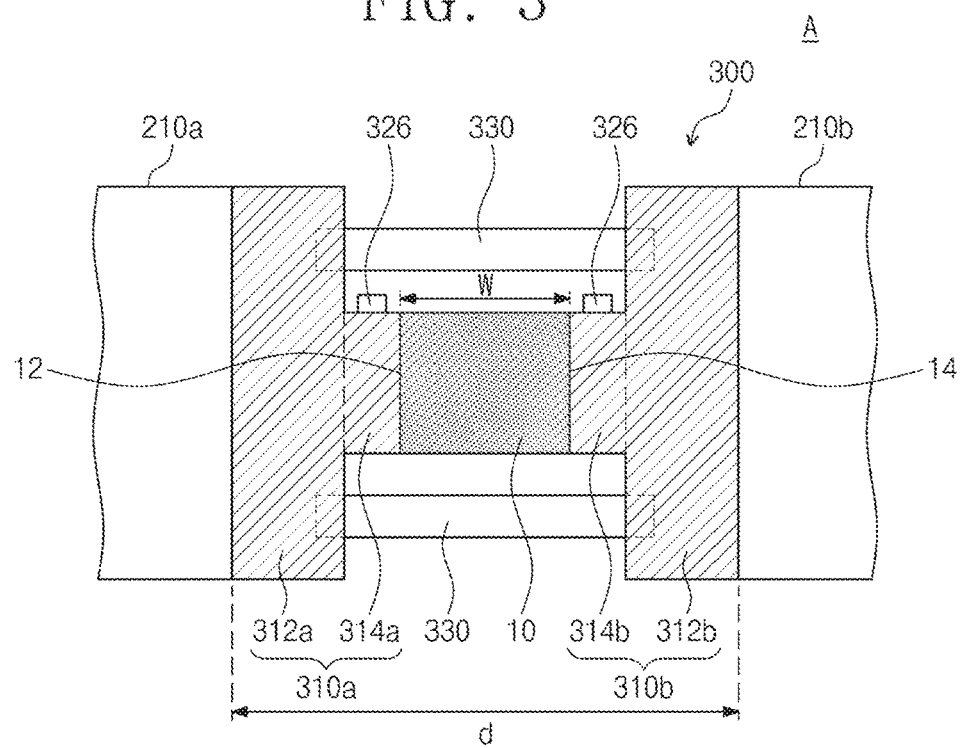
FIG. 3 is a view corresponding to a portion A in FIG. 1.
Figure 4:
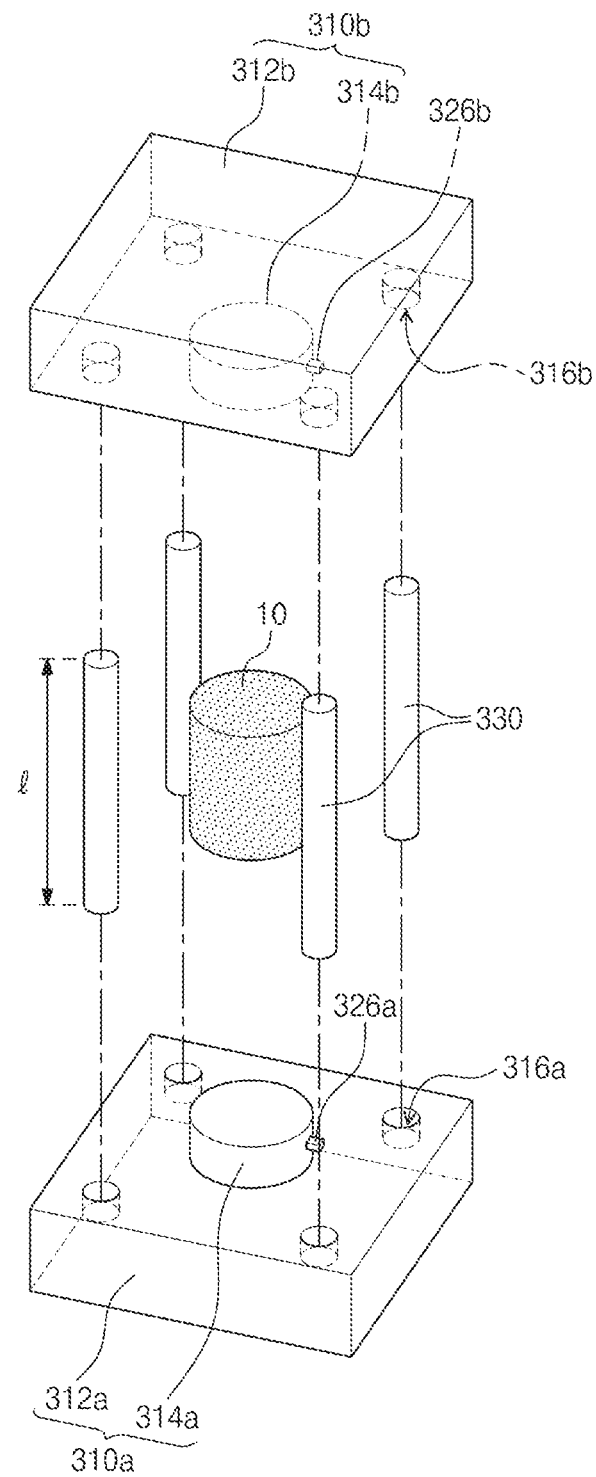
FIG. 4 is an exploded perspective view of a fixing module in FIG. 1.

FIGS. 1 and 2 are views for explaining a thermoelectric performance measuring device according to an embodiment of the inventive concept. FIG. 3 is a view corresponding to a portion A in FIG. 1. FIG. 4 is an exploded perspective view of a fixing module in FIG. 1.

Referring to FIG. 1, a thermoelectric performance measuring device 1 may include a chamber 100, a support module 200, and a fixing module 300. The chamber 100 may define an inner space for measuring a thermoelectric performance of a thermoelectric material. The chamber 100 may divide inner and outer atmospheres of the chamber 100 while the thermoelectric performance is measured. A decompression member 104 may be pipe-connected to the chamber 100. For example, the pressure reducing member 104 may be a turbo pump. The chamber 100 may maintain a vacuum state by the pressure reducing member 104 while the thermoelectric performance is measured.

The support module 200 may be disposed in the chamber 100. As illustrated in FIG. 1, the support module 200 may support the fixing module 300. For example, the support module 200 may apply pressure to both ends of the fixing module 300 to support the fixing module 300. The support module 200 may generate temperature difference between both ends of the thermoelectric material 10. In detail, the support module 200 may apply heat to the fixing module 300 to generate temperature difference between both ends of a thermoelectric material 10.

The support module 200 may include a first support module 200a and a second support module 200b, which face each other. The first support module 200a may include a first support bar 202a and a first temperature adjusting part 210a. The first support bar 202a may be disposed on a bottom surface 102 of the chamber 100. The first temperature adjusting part 210a may be supported by the first support bar 202a and spaced apart from the bottom surface 102 of the chamber 100. The first temperature adjusting part 210a may include a first temperature adjusting module 230a. According to an embodiment, the first temperature adjusting module 230a may include a heater 232a and a cooler 234a.

The second support module 200b may include a second support bar 202b and a second temperature adjusting part 210b. The second support bar 202b may be disposed on the bottom surface 102 of the chamber 100. The second temperature adjusting part 210b may be supported by the second support bar 202b. The second temperature adjusting part 210b may be supported by the second support bar 202b and spaced apart from the bottom surface 102 of the chamber 100. The second temperature adjusting part 210b may include a second temperature adjusting module 230b. According to an embodiment, the second temperature adjusting module 230b may include a heater 232b and a cooler 234b.

As each of the first temperature adjusting part 210a and the second temperature adjusting part 210b includes the heater 232a or 232b and the cooler 234a or 234b, the first temperature adjusting part 210a and the second temperature adjusting part 210b may be precisely adjusted in temperature even in the vacuum state. Accordingly, reliability in thermoelectric performance measurement may be improved.

The support module 200 may apply a predetermined pressure to the fixing module 300 to support the fixing module 300. In detail, the fixing module 300 may contact the first temperature adjusting part 210a and the second temperature adjusting part 210b, and the first temperature adjusting part 210a and the second temperature adjusting part 210b may support the fixing module 300 through frictional force and/or normal force with the fixing module 300. The fixing module 300 may be supported by the support module 200 and spaced apart from the bottom surface 102 of the chamber 100. As the fixing module 300 is spaced apart from the bottom surface 102 of the chamber 100, unnecessary heat transfer with an inner wall of the chamber 100 may be prevented. Accordingly, the reliability in thermoelectric performance measurement may be improved.

A transfer module 110 may be disposed in the chamber 100. The transfer module 110 may be coupled to at least one of the first support module 200a and the second support module 200b. For example, the transfer module 110 may be disposed between the second support bar 202b and the bottom surface 102 of the chamber 100. The transfer module 110 may linearly move the second support module. As illustrated in FIG. 2, the transfer module 110 may move the second support module 200b to detach/attach the fixing module 300 from/to the support module 200.

In detail, the transfer module 110 may be disposed on the bottom surface 102 of the chamber 100, and the second support bar 202b may be disposed on the transfer module 110. The transfer module 110 may include a driving portion 112 and a rail 114. The driving portion 112 may be disposed adjacent to the bottom surface 102 of the chamber 100. The rail 114 may be disposed on an upper portion of the driving portion 112. The driving portion 112 may include a rotating roller (not shown). The rotating roller (not shown) may pass through at least a portion of the rail 114 to protrude toward the second support bar 202b. The second support bar 202b may be supported by the rotating roller (not shown) and the rail 114 to slide along the rail 114 That is, the transfer module 110 may move the second support bar 202b so that a distance d between the first temperature adjusting part 210a and the second temperature adjusting part 210b is adjustable.

As illustrated in FIG. 2, as the second support bar 202b moves away from the first support bar 202a, the fixing module 300 may be separated from the support module 200. As illustrated in FIG. 1, as the second support bar 202b moves adjacent to the first support bar 202a, the fixing module 300 may be coupled to the support module 200. Hereinafter, the fixing module 300 will be described in detail with reference to FIGS. 3 and 4.

Referring to FIGS. 3 and 4, the fixing module 300 may include a first heat sink part 310a, a second heat sink part 310b, and a stress-maintaining member 330. The fixing module 300 may apply a predetermined pressure to the thermoelectric material 10 to support the thermoelectric material 10. Pressure applied while the fixing module 300 supports the thermoelectric material 10 may be constantly maintained by the stress maintaining member 330. The fixing module 300 may receive heat from the first temperature adjusting part 210a and the second temperature adjusting part 210b to generate temperature difference between the both ends of the thermoelectric material 10 while coupled to the support module 200.

The first heat sink part 310a may include a first body portion 312a and a first protruding portion 314a. While the fixing module 300 is supported and fixed by the support module 200, the first body portion 312a may closely contact the first temperature adjusting part 210a. The first body portion 312a and the first protruding portion 314a may be integrated with each other. As illustrated in FIG. 4, approximately, the first body portion 312a may have a rectangular parallelepiped shape, and the first protruding portion 314a may have a cylindrical shape protruding from the first body portion 312a. However, embodiments of the inventive concept are not limited thereto. Each of the first body portion 312a and the first protruding portion 314a may include a conductive material. For example, the conductive material may include metal having high thermal conductivity.

As illustrated in FIG. 4, the first heat sink part 310a may include at least one first guide groove 316a. In detail, the first guide groove 316a may be defined in one surface of the first heat sink part 310a, on which the first protruding portion 314a is disposed. The first guide grooves 316a may be disposed adjacent to an edge of the first heat sink part 310a on the one surface of the first heat sink part 310a. The first guide groove 316a may have a circular shape in terms of a plane. The first guide groove 316a may be a groove recessed in a direction away from the second heat sink part 310b on the one surface of the first heat sink part 310a, on which the first protruding portion 314a is disposed. For example, the first guide groove 316a may have a cylindrical shape.

The second heat sink part 310b may include a second body portion 312b and a second protruding portion 314b. While the fixing module 300 is coupled to the support module 200, the second body portion 312b may closely contact the second temperature adjusting part 210b. The second body portion 312b and the second protruding portion 314b may be integrated with each other. Approximately, the second body portion 312b may have a rectangular parallelepiped shape, and the second protruding portion 314b may have a cylindrical shape protruding from the second body portion 312b. However, embodiments of the inventive concept are not limited thereto. Each of the second body portion 312b and the second protruding portion 314b may include a conductive material. For example, the conductive material may include metal having high thermal conductivity.

As illustrated in FIG. 4, the second heat sink part 310b may include the second guide groove 316b that is the same in number as the first guide groove 316a. The second guide groove 316b may be defined in one surface of the second heat sink part 310b, on which the second protruding portion 314b is disposed. The second guide groove 316b may be disposed to face the first guide groove 316a. The second guide groove 316b may be identical or similar to the first guide groove 316a.

The fixing module 300 may support the thermoelectric material 10. In detail, the first heat sink part 310a and the second heat sink part 310b may apply pressure to the both ends of the thermoelectric material 10 to support the thermoelectric material 10. The thermoelectric material 10 may be disposed between the first heat sink part 310a and the second heat sink part 310b. While the fixing module 300 supports the thermoelectric material 10, the first heat sink part 310a and the second heat sink part 310b may be spaced apart from each other with the thermoelectric material 10 therebetween. The thermoelectric material 10 may closely contact the first protruding portion 314a and the second protruding portion 314b. As the fixing module 300 applies a pressure to the both ends of the thermoelectric material 10, the fixing module 300 may stably support the thermoelectric material 10 even when the thermoelectric material 10 has a small width w. The thermoelectric performance measuring device 1 according to an embodiment of the inventive concept may measure the thermoelectric performance of the thermoelectric material 10 even when the thermoelectric material 10 has the width w less than about 3 mm.

The stress maintaining member 330 may be disposed between the first heat sink part 310a and the second heat sink part 310b. The stress maintaining member 330 may include an elastic body. The stress-maintaining member 330 may be an insulator. The stress maintaining member 330 may have a length l equal to or less than the sum of widths of the first protruding portion 314a, the second protruding portion 314b, and the thermoelectric material 10 and depths of the first guide groove 316a and the second guide groove 316b. The stress maintaining member 330 may be inserted into and coupled to the first guide groove 316a and the second guide groove 316b. While the fixing module 300 applies the pressure to support the thermoelectric material 10, the pressure may be constantly maintained by the stress maintaining member 330.

As the pressure applied to the thermoelectric material 10 is constantly maintained by the stress maintaining member 330, the thermoelectric material 10 may be prevented from being broken, and physical properties of the thermoelectric material 10 may be prevented from being changed while the thermoelectric performance is measured. Accordingly, the reliability in thermoelectric performance measurement may be improved.

Referring to FIG. 1 again, the thermoelectric performance measuring device 1 may include a temperature control unit 410, a temperature measuring unit 420, an electromotive force measuring unit 430, and a thermoelectric performance calculation unit 450. The temperature control unit 410 may provide a control signal to the support module 200. Accordingly, the support module 200 may be heated and/or cooled. The temperature measuring unit 420 may measure temperature of each of the both ends of the thermoelectric material 10. The electromotive force measuring unit 430 may measure thermoelectromotive force generated from the thermoelectric material 10. The thermoelectric performance calculation unit 450 may receive temperature data and electromotive force data from the temperature measuring unit 420 and the electromotive force measuring unit 430 to calculate the thermoelectric performance.

In detail, the temperature control unit 410 may be electrically connected to the support module 200. The temperature control unit 410 may be electrically connected to the first temperature adjusting part 210a and the second temperature adjusting part 210b. In more detail, the temperature control part 410 may be electrically connected to each of heaters 232a and 232b and coolers 234a and 234b in the first temperature adjusting part 210a and the second temperature adjusting part 210b. The temperature control part 410 may control temperature of each of the first temperature adjusting part 210a and the second temperature adjusting part 210b. For example, the temperature control part 410 may control the heaters 232a and 232b and the coolers 234a and 234b to generate temperature difference between the first temperature adjusting part 210a and the second temperature adjusting part 210b. Heat generated from the first temperature adjusting part 210a and the second temperature adjusting part 210b may be transferred to the both ends of the thermoelectric material 10 through the fixing module 300. Thus, the temperature difference between the both ends of the thermoelectric material 10 may be generated. Accordingly, the thermoelectromotive force may be generated in the thermoelectric material 10.

The temperature measuring unit 420 may be electrically connected to the fixing module 300. In detail, the temperature measuring unit 420 may be electrically connected to each of the first heat sink part 310a and the second heat sink part 310b. The temperature measuring unit 420 may measure temperature of each of a first surface 12 and a second surface 14 of the thermoelectric material 10. The temperature measuring unit 420 may be electrically connected to the temperature control unit 410. The temperature control unit 410 may be feedback-controlled by the temperature measuring unit 420. For example, while the thermoelectric performance is measured, the temperature control unit 410 may receive temperature data from the temperature measuring unit 420 to maintain a predetermined temperature difference between the first surface 12 and the second surface 14 of the thermoelectric material 10. The temperature control unit 410 may provide the control signal to the first temperature adjusting part 210a and the second temperature adjusting part 210b so that the first heat sink part 310a and the second heat sink part 310b maintain a predetermined temperature difference.

The electromotive force measuring unit 430 may be electrically connected to the fixing module 300. The electromotive force measuring unit 430 may be electrically connected to each of the first heat sink part 310a and the second heat sink part 310b of the fixing module 300 to measure the thermoelectromotive force generated between the both ends of the thermoelectric material 10.

According to an embodiment, as illustrated in FIGS. 3 and 4, the fixing module 300 may include one or more connection terminals 326a and 326b. The connection terminals 326a and 326b may be respectively disposed at one side of the first protruding portion 314a and one side of the second protruding portion 314b of the fixing module 300. The fixing module 300 may be connected to the temperature measuring unit 420 and the electromotive force measuring unit 430 through the connection terminals 326a and 326b.

The thermoelectric performance calculation unit 450 may be electrically connected to the temperature measuring unit 420 and the electromotive force measuring unit 430. The thermoelectric performance calculation unit 450 may receive the temperature data of the both ends of the thermoelectric material 10 from the temperature measuring unit 420. The thermoelectric performance calculation unit 450 may receive thermoelectromotive force data generated between the both ends of the thermoelectric material 10 from the electromotive force measuring unit 430. The thermoelectric performance of the thermoelectric material 10 may be calculated by the thermoelectric performance calculation unit 450.

Figure 5:
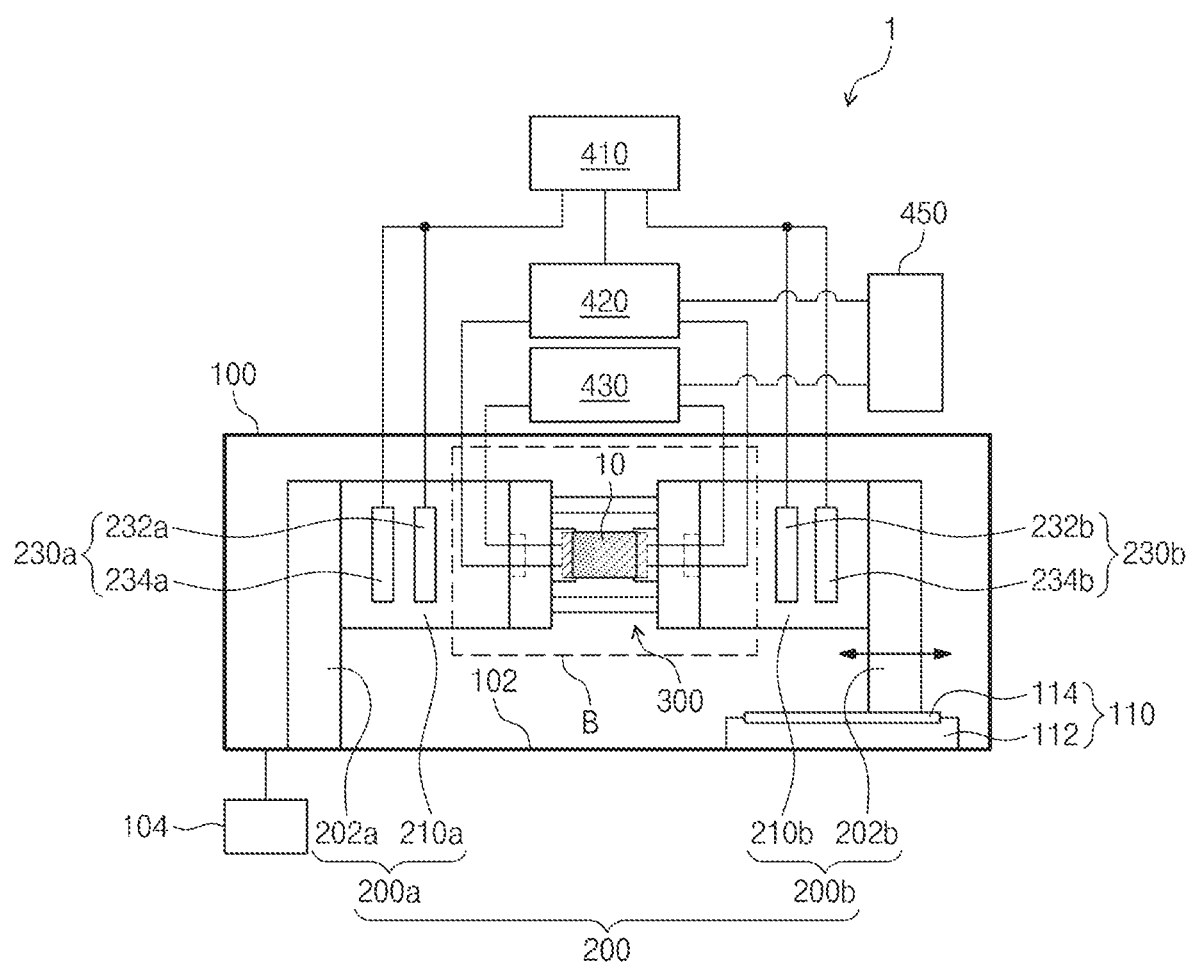
FIGS. 5 and 6 are views for explaining a thermoelectric performance measuring device according to an embodiment of the inventive concept.
Figure 6:
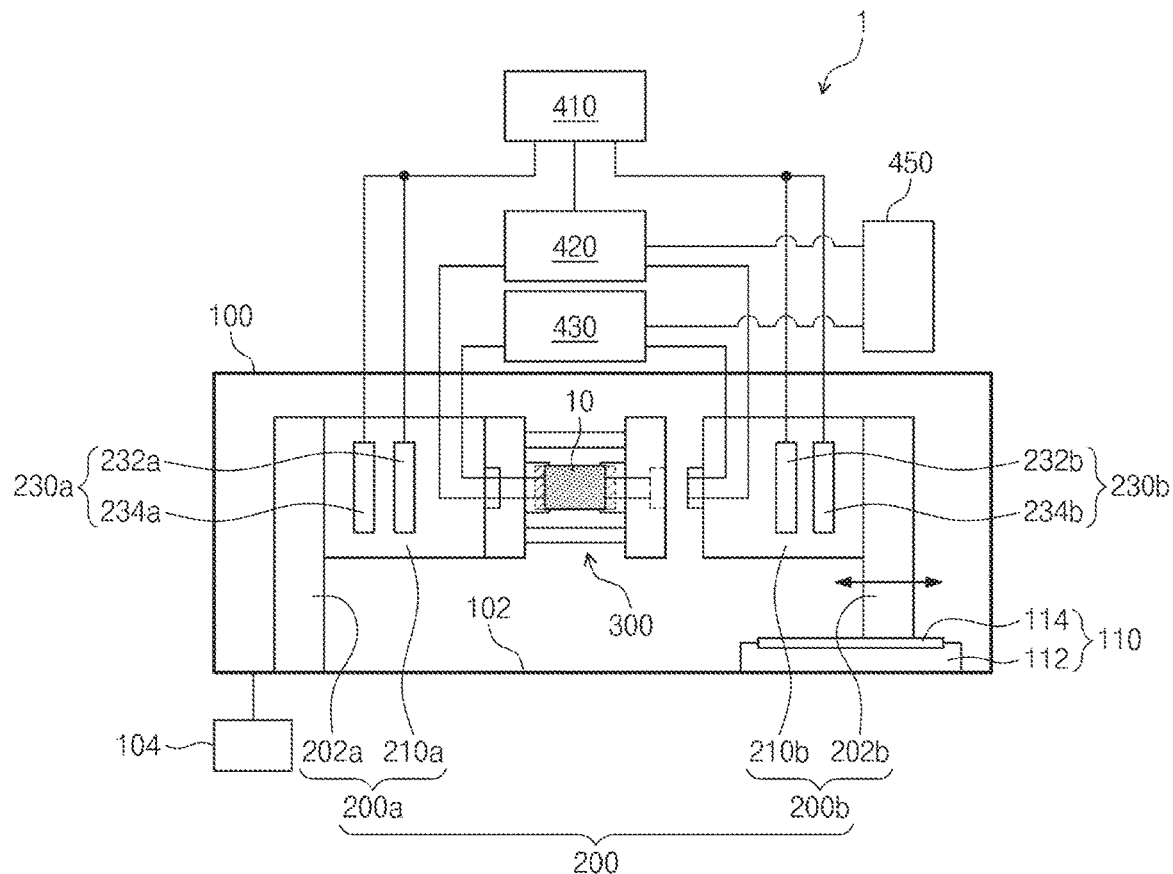
Figure 7:
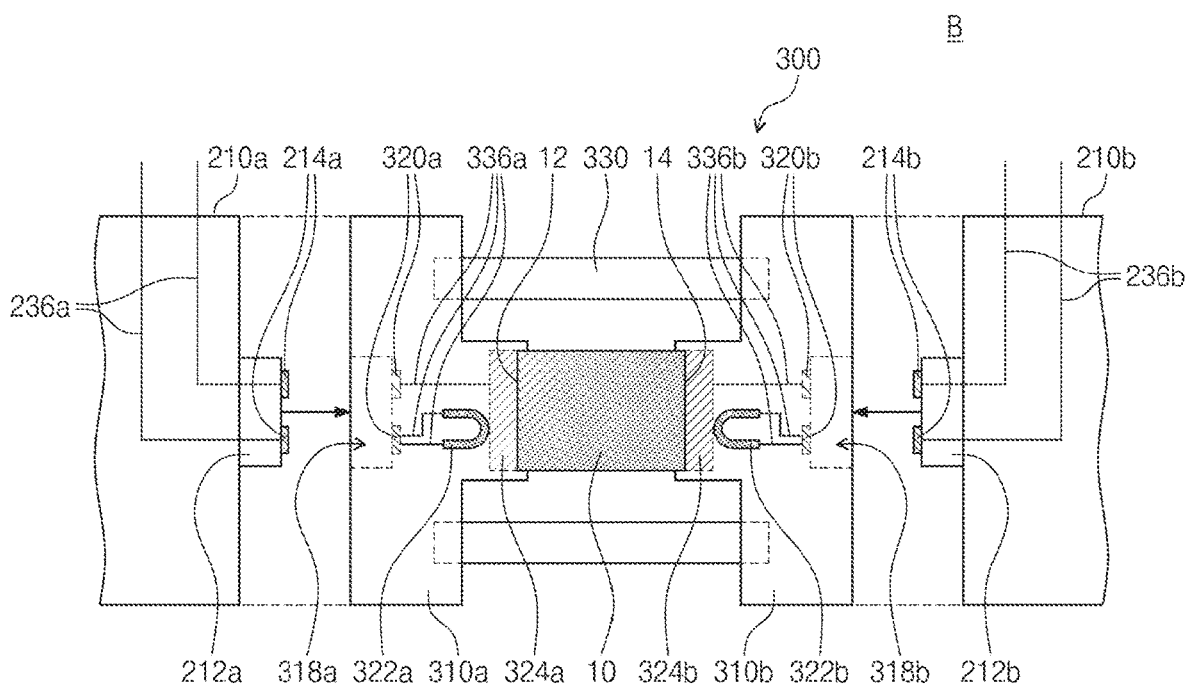
FIG. 7 is a view corresponding to a portion B in FIG. 5.
Figure 8:
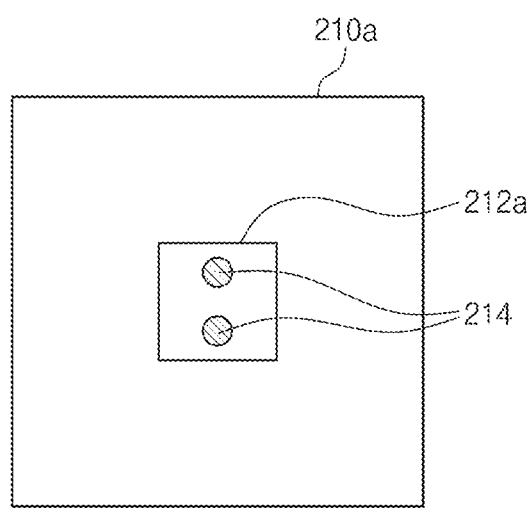
FIG. 8 is a plan view corresponding to a temperature adjusting part in FIG. 7.
Figure 9:
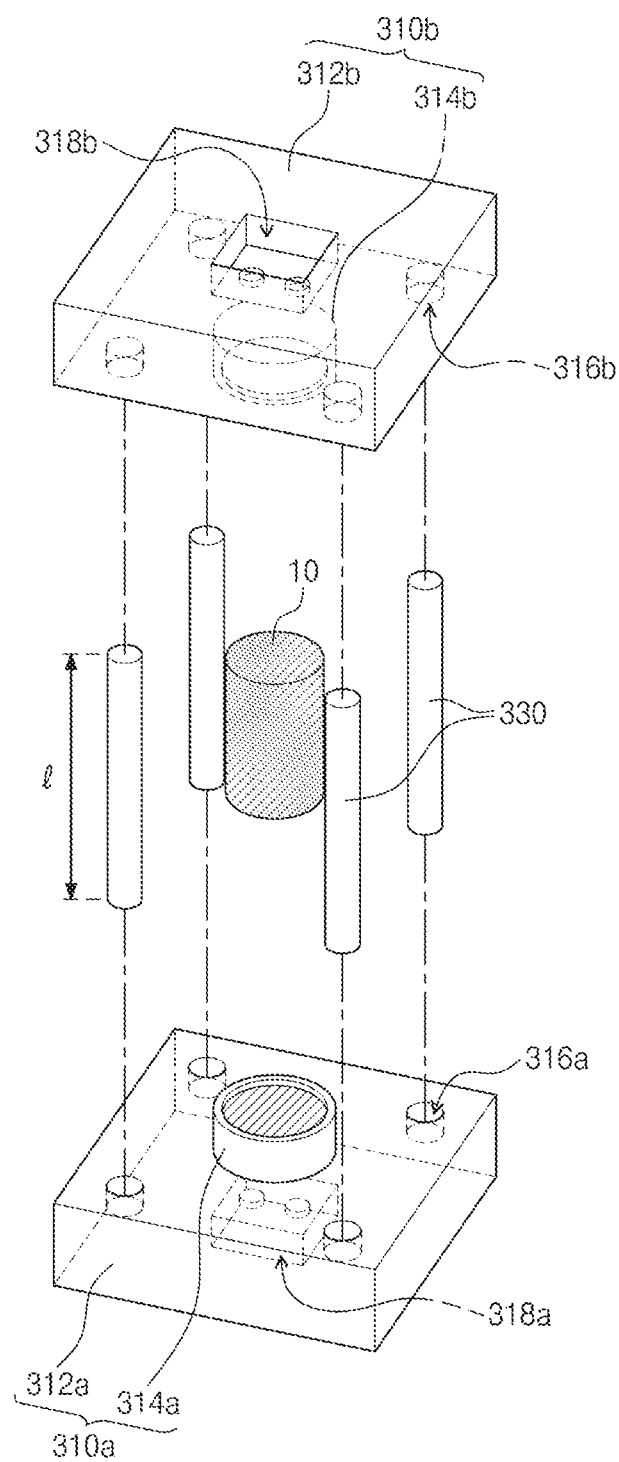
FIG. 9 is an exploded perspective view corresponding to a fixing module in FIG. 7.
Figure 10:
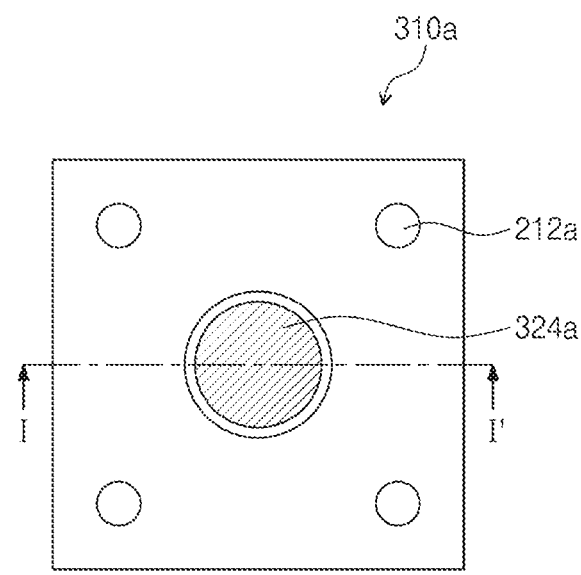
FIG. 10 is a plan view corresponding to a first heat sink part in FIG. 9.
Figure 11:
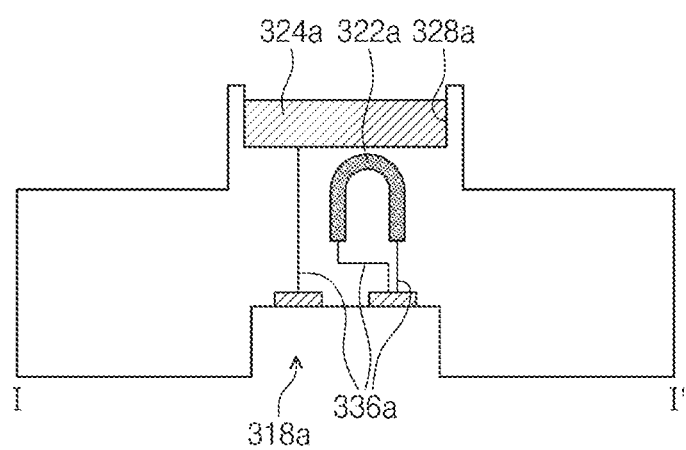
FIG. 11 is a view taken along I-I' in FIG. 10.

FIGS. 5 and 6 are views for explaining a thermoelectric performance measuring device according to an embodiment of the inventive concept. FIG. 7 is a view corresponding to a portion B in FIG. 5. FIG. 8 is a plan view corresponding to a temperature adjusting part in FIG. 7. FIG. 9 is an exploded perspective view corresponding to a fixing module in FIG. 7. FIG. 10 is a plan view corresponding to a first heat sink part in FIG. 9. FIG. 11 is a view taken along I-I' in FIG. 10.

Detailed description for overlapped elements will be omitted for simplification of description, and different aspects with the thermoelectric performance measuring device in FIGS. 1 to 4 will be mainly described.

According to an embodiment, as illustrated in FIGS. 7 and 8, the first temperature adjusting part 210a may include a first coupling protrusion 212a. The second temperature adjusting part 210b may include a second coupling protrusion 212b on one surface facing the first temperature adjusting part 210a. First terminals 214a and 214b may be disposed on the first and second coupling protrusions 212a and 212b. The first terminal 214a on the first coupling protrusion 212a and the first terminal 214b on the second coupling protrusion 212b may face each other. The first terminals 214a and 214b may be electrically connected to the temperature measuring unit 420 and the electromotive force measuring unit 430, respectively. In detail, the temperature measuring unit 420 and the electromotive force measuring unit 430 may be electrically connected to the first terminals 214a and 214b through first wires 236a and 236b passing through at least a portion of the support module 200.

As illustrated in FIGS. 7, 9, and 11, the fixing module 300 may include coupling grooves 318a and 318b. According to an embodiment, the first heat sink part 310a may include the first coupling groove 318a. The second heat sink part 310b may include the second coupling groove 318b. The first terminal 320a may be disposed in the first coupling groove 318a. The second terminal 320b may be disposed in the second coupling groove 318b.

According to an embodiment, each of the first heat sink part 310a and the second heat sink part 310b may be an insulator. Each of the first heat sink part 310a and the second heat sink part 310b may have thermal conductivity equal to or greater than at least about 50 W/mk. Each of the first heat sink part 310a and the second heat sink part 310b may include epoxy resin and/or ceramics. For example, each of the first heat sink part 310a and the second heat sink part 310b may include silicon nitride ceramics ($Si_3N_4$). However, an embodiment of the inventive concept is not limited thereto. The materials of the first heat sink part 310a and the second heat sink part 310b may be appropriately selected from materials having a high insulating property and high thermal conductivity.

According to an embodiment, as illustrated in FIG. 11, the first heat sink part 310a may include a temperature sensor 322a and an electrode 324a. According to an embodiment, the first heat sink part 310a may include a groove in the protruding portion 328a recessed toward the first body portion 312a on a top surface of the first protruding portion 314a. The electrode 324a may be disposed in the groove in the protruding portion 328a. The electrode 324a may be electrically connected to the second terminals 320a. In detail, the electrode 324a may be electrically connected to the second terminals 320a through second wires 336a passing through at least a portion of the fixing module 300.

The electrode 324a may be spaced apart from the top surface of the first protruding portion 314a. As the electrode 324a is spaced apart from the top surface of the first protruding portion 314a, the top surface of the first protruding portion 314a may have a recessed shape. As the top surface of the first protruding portion 314a has a recessed shape, the first protruding portion 314a may stably support the thermoelectric material 10.

The temperature sensor 322a may be disposed in the first heat sink part 310a. In detail, while the fixing module 300 supports the thermoelectric material 10, the temperature sensor 322a may be disposed adjacent to the top surface of the first protruding portion 314a so that the temperature sensor 322a is disposed adjacent to the thermoelectric material 10. The temperature sensor 322a may be electrically connected to the second terminals 320a by the second wires 336a passing through at least a portion of the fixing module 300. The temperature sensor 322a may be a thermocouple.

The second heat sink part 310b may be the same as or similar to the above-described first heat sink part 310a. That is, as illustrated in FIG. 7, the second heat sink part 310b may include the electrode 324b, the temperature sensor 322b, and the second terminals 320b, and the electrode 324b and the temperature sensor 322b may be respectively electrically connected to the second terminals 320b.

According to embodiments of the inventive concept, the support module may include the coupling protrusions. The fixing module may include the coupling grooves. When the fixing module is coupled to the support module, the coupling protrusions may be inserted into and coupled to the coupling grooves, respectively. Accordingly, the fixing module may be stably coupled to the support module.

According to embodiments of the inventive concept, the support module may include the first terminals, and the fixing module may include the second terminals. While the fixing module is coupled to the support module, the first terminals may be electrically connected to the second terminals. Accordingly, the fixing module may be electrically connected to the support module without additional wiring work.

Hereinafter, a method for measuring a thermoelectric performance using the above-described thermoelectric performance measuring device 1 will be described in detail.

Referring to FIGS. 5 to 11 again, the thermoelectric material 10 may be coupled to the fixing module 300. According to an embodiment, the thermoelectric material 10 may be disposed on the first protruding portion 314a of the first heat sink part 310a. The stress maintaining members 330 may be inserted into and coupled to first guide grooves 316a. The second guide grooves 316b of the second heat sink part 310b may be disposed to face the stress maintaining members 300 so that the stress maintaining members 300 are respectively inserted into and coupled to the guide grooves 316b. The thermoelectric material 10 may be disposed between the first protruding portion 314a and the second protruding portion 314b. In detail, the first protruding portion 314a and the second protruding portion 314b may apply a predetermined pressure to the both ends of the thermoelectric material 10 to support the thermoelectric material 10. The above pressure may be constantly maintained by the stress maintaining members 330. For example, a process of coupling the thermoelectric material 10 to the fixing module 300 may be performed outside the chamber 100. Accordingly, the thermoelectric material 10 may be easily coupled to the fixing module 300.

The fixing module 300 may be coupled to the support module 200. According to an embodiment, the first heat sink part 310a may be coupled to the first support module 200a. The first coupling protrusion 212a of the first support module 200a may be inserted into and coupled to the first coupling groove 318a of the first heat sink part 310a. The first terminal 214a of the first coupling protrusion 212a may contact the second terminal 320a of the first heat sink part 310a. The first terminal 214a and the second terminal 320a may be electrically connected to each other.

As illustrated in FIGS. 5 and 6, the transfer module 110 may operate to move the second support module 200b toward the first support module 200a. Accordingly, the second coupling protrusion 212b of the second support module 200b may be inserted into and coupled to the second coupling groove 318b of the second heat sink part 310b. The first terminal 214b on the second coupling protrusion 212b may contact the second terminal 320b of the second heat sink part 310b. The first terminal 214a and the second terminal 320a may be electrically connected to each other. Accordingly, the fixing module 300 may be electrically connected to the temperature measuring unit 420 and the electromotive force measuring unit 430. Also, the thermoelectric material 10 may be electrically connected to the electromotive force measuring unit 430.

An inside of the chamber 100 may be decompressed. A process of decompressing the inside of the chamber 100 may be performed by using the pressure reducing member 104. While the thermoelectric performance is measured, the inside of the chamber 100 may maintain a pressure less than atmospheric pressure or a vacuum state by the pressure reducing member 104. While the thermoelectric performance is measured, as the inside of the chamber 100 maintains the vacuum state, heat transfer caused by air may be prevented.

The temperature difference between the both ends of the thermoelectric material 10 may be generated. In detail, the temperature control unit 410 may provide a control signal to the first temperature adjusting part 210a and the second temperature adjusting part 210b. The first temperature adjusting part 210a and the second temperature adjusting part 210b may be heated and/or cooled. A predetermined temperature difference may be generated between the first temperature adjusting part 210a and the second temperature adjusting part 210b.

The first temperature adjusting part 210a and the second temperature adjusting part 210b may transfer heat to the both ends of the thermoelectric material 10 through the first heat sink part 310a and the second heat sink part 310b. Accordingly, the temperature difference between the both ends of the thermoelectric material 10 may be generated.

The temperature of the both ends of the thermoelectric material 10 may be measured. As described above, the temperature sensors 322a and 322b may be respectively disposed on the first heat sink part 310a and the second heat sink part 310b of the fixing module 300. While the fixing module 300 supports the thermoelectric material 10, the temperature sensors 322a and 322b may be respectively disposed adjacent to the first surface 12 and the second surface 14 of the thermoelectric material 10. Temperature of each of the first and second surfaces 12 and 14 of the thermoelectric material 10 may be measured by each of the temperature sensors 322a and 322b disposed adjacent to the thermoelectric material 10. According to an embodiment, the temperature data of the both ends of the thermoelectric material 10 may be provided to the temperature control unit 410. Accordingly, the temperature control unit 410 may provide the control signal to the first temperature adjusting part 210a and the second temperature adjusting part 210b so that the first surface 12 and the second surface 14 of the thermoelectric material 10 maintain a predetermined temperature difference. That is, the temperature control unit 410 may be feedback-controlled by the temperature measuring unit 420.

The thermoelectromotive force generated between the both ends of the thermoelectric material 10 may be measured. As the temperature difference between the both ends of the thermoelectric material 10 is generated, the thermoelectromotive force may be generated. The thermoelectromotive force may be generated by the Seebeck effect. As described above, the electrodes 324a and 324b may be disposed adjacent to the both ends of the thermoelectric material 10. The electrodes 324a and 324b may be electrically connected to the electromotive force measuring unit 430. The thermoelectromotive force generated between the both ends of the thermoelectric material 10 may be measured by the electromotive force measuring unit 430.

The thermoelectric performance may be calculated. The temperature data measured by the temperature measuring unit 420 and the thermoelectromotive force data measured by the thermoelectromotive force measuring unit 430 may be provided to the thermoelectric performance calculation unit 450. The thermoelectric performance calculation unit 450 may calculate the thermoelectric performance on the basis of the temperature data and the thermoelectromotive force data.

According to embodiments of the inventive concept, the thermoelectric performance measuring device may include the fixing module detachably coupled to the support module and capable of applying a predetermined pressure to the both ends of the thermoelectric material to support the thermoelectric material. Accordingly, even when the thermoelectric material has a small size (e.g., a size equal to or less than about 3 mm), the thermoelectric material may be easily mounted on the thermoelectric performance measuring device.

According to embodiments of the inventive concept, the fixing module may include the stress maintaining member constantly maintaining the pressure applied to the both ends of the thermoelectric material. Accordingly, while the thermoelectric performance is measured, the thermoelectric material is prevented from being broken or the physical properties are prevented from being changed, and thus, the reliability in the thermoelectric performance measurement may be improved.

According to embodiments of the inventive concept, the thermoelectric performance measuring device may include the fixing module including the first terminal, the support module connected to the temperature measuring unit and the electromotive force measuring unit, and the second terminal. Here, the first terminal and the second terminal may be connected to each other. Accordingly, the additional wiring work may be unnecessary after the fixing module is coupled to the support module, and thus, the thermoelectric performance may be easily measured.

According to the embodiments of the inventive concept, the thermoelectric performance measuring device may include the fixing module detachably coupled to the support module and capable of applying the predetermined pressure to the both ends of the thermoelectric material to support the thermoelectric material. Accordingly, even when the thermoelectric material has the small size (e.g., size equal to or less than about 3 mm), the thermoelectric material may be easily mounted on the thermoelectric performance measuring device.

According to the embodiments of the inventive concept, the fixing module may include the stress maintaining member constantly maintaining the pressure applied to the both ends of the thermoelectric material. Accordingly, while the thermoelectric performance is measured, the thermoelectric material is prevented from being broken or the physical properties are prevented from being changed, and thus, the reliability in the thermoelectric performance measurement may be improved.

According to the embodiments of the inventive concept, the thermoelectric performance measuring device may include the fixing module including the first terminal, the support module connected to the temperature measuring unit and the electromotive force measuring unit, and the second terminal. Here, the first terminal and the second terminal may be connected to each other. Accordingly, the additional wiring work may be unnecessary after the fixing module is coupled to the support module, and thus the thermoelectric performance may be easily measured.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Therefore, the embodiments described above include exemplary in all respects and not restrictive, but it should be understood.

What is claimed is:

1. A device for measuring a thermoelectric performance of a thermoelectric material comprises:
   a support module configured to generate temperature difference between both ends of the thermoelectric material;
   a fixing module supporting the thermoelectric material, the fixing module being detachably coupled to the support module;
   a temperature measuring unit electrically connected to the fixing module to measure temperature of each of the both ends of the thermoelectric material; and
   an electromotive force measuring unit electrically connected to the fixing module to measure thermoelectromotive force generated between the both ends of the thermoelectric material,
   wherein the fixing module comprises a first heat sink part and a second heat sink part, which respectively support the both ends of the thermoelectric material,
   wherein the first heat sink part and the second heat sink part apply pressure to the both ends of the thermoelectric material to support the thermoelectric material, and
   wherein the fixing module comprises at least one stress maintaining member disposed between the first heat sink part and the second heat sink part, and, while the fixing module supports the thermoelectric material, the pressure is constantly maintained by the stress maintaining member.

2. The device of claim 1, wherein the first heat sink part comprises at least one first guide groove,
   the second heat sink part comprises at least one second guide groove, and
   the stress maintaining member is inserted into and coupled to the first guide groove and the second guide groove.

3. The device of claim 1, wherein each of the first heat sink part and the second heat sink part comprises:
   an electrode; and
   a temperature sensor,
   wherein, while the fixing module is coupled to the support module, the electrode is electrically connected to the electromotive force measuring unit, and the temperature sensor is electrically connected to the temperature measuring unit.

4. The device of claim 1, wherein the support module comprises a first support module and a second support module, and
   the first support module and the second support module respectively apply pressure to both ends of the fixing module to support the fixing module.

5. The device of claim 4, further comprising a transfer module,
   wherein the second support module moves to be disposed adjacent to or spaced apart from the first support module by the transfer module, thereby being coupled to or separated from the fixing module.

6. The device of claim 4, wherein each of the first support module and the second support module comprises a coupling protrusion disposed on each of mutually facing ends thereof,
   the fixing module comprises a coupling groove defined in each of both ends facing the support modules, and,
   when the fixing module is coupled to the support module, the coupling protrusion is inserted into and coupled to the coupling groove.

7. The device of claim 1, wherein the support module comprises a first support module and a second support module,
   each of the first support module and the second support module comprises a first terminal disposed on each of mutually facing surfaces thereof,
   the fixing module comprises a second terminal disposed on each of surfaces facing the support modules, and,
   while the fixing module is coupled to the support module, the first terminal is electrically connected to the second terminal.

8. The device of claim 7, wherein the temperature measuring unit and the electromotive force measuring unit are electrically connected to the first terminal through first wires.

9. The device of claim 7, wherein each of the first heat sink part and the second heat sink part comprises:
   an electrode; and
   a temperature sensor, and
   the electrode and the temperature sensor are electrically connected to the second terminal through second wires.

10. The device of claim 1, wherein each of the first heat sink part and the second heat sink part comprises:
    an electrode; and
    a temperature sensor, and,
    while the fixing module supports the thermoelectric material, the electrode contacts the thermoelectric material, and the temperature sensor is disposed adjacent to the thermoelectric material.

11. The device of claim 1, further comprising a temperature control unit configured to control temperature of the support module,
    wherein the temperature control unit is feedback-controlled by temperature measuring unit.

12. The device of claim 1, further comprising a vacuum chamber,
    wherein the support module is disposed in the vacuum chamber, and the chamber maintains a vacuum state while the thermoelectric performance of the thermoelectric material is measured.

13. The device of claim 12, wherein, while the thermoelectric performance of the fixing module is measured, the fixing module is supported by the support module and spaced apart from a bottom surface of the chamber.

* * * * *